3,712,995

INPUT TRANSIENT PROTECTION FOR COMPLEMENTARY INSULATED GATE FIELD EFFECT TRANSISTOR INTEGRATED CIRCUIT DEVICE

Goetz Wolfgang Steudel, Flemington, N.J., assignor to RCA Corporation

Filed Mar. 27, 1972, Ser. No. 238,486
Int. Cl. H01l 19/00
U.S. Cl. 307—304 7 Claims

ABSTRACT OF THE DISCLOSURE

A COS/MOS integrated circuit device of the type having a diffused well region and complementary insulated gate field effect transistors inside and outside the well region, respectively, has an integral circuit for protecting the gate insulators of the insulated gate field effect transistors from destructive transients. The protection circuit includes a diffused resistor made at the same time as the source and drain regions of the transistor which is within the well region. The diffused resistor is disposed within a region made at the same time as the well region.

BACKGROUND OF THE INVENTION

This invention relates to integrated circuits employing insulated gate field effect transistors, particularly MOS transistors.

The transistors in known integrated circuits employing insulated gate field effect transistors include a gate insulator which is usually of thermally grown silicon dioxide. Silicon dioxide has a breakdown strength of about $10^7$ volts per cm. and consequently any transient voltage on the gate electrode of about 10 volts per 100 A. of oxide will probably cause breakdown of the oxide. This problem has usually existed only during manufacturing, testing, assembly, or other handling of the devices because normal circuit impedances and voltages make damage of this nature unlikely. Nevertheless, the breakdown effect is destructive and consequently devices have been lost prior to insertion into a circuit.

One known solution to the transient breakdown problem is shown in FIG. 1. The circuit 10 of FIG. 1 is used in commercially available devices such as the CD4013 integrated circuit device available from RCA Corporation. The circuit to be protected is represented in FIG. 1 by a simple complementary pair inverter including a P type insulated gate field effect transistor 12 and an N type insulated gate field effect transistor 14 connected in series between a supply terminal 16, labeled $V_{dd}$, and a supply terminal 18, labeled $V_{ss}$. The transistors 12 and 14 have insulated gate electrodes 20 and 22 which are connected together so that each receives the same input signal. The respective drains of the transistors 12 and 14 are connected together and to an output terminal 23.

The circuit elements which provide protection for the gate insulators of the transistors 12 and 14 are connected between an input terminal 24, the gates 20 and 22, and the terminals 16 and 18 as follows. First, there is a resistor 26 which is connected between the input terminal 24 and the gates 20 and 22. From the resistor 26 to the $V_{dd}$ terminal 16 there are diodes 28–29 which have their anodes connected to the resistor 26 and their cathodes connected together and to the terminal 16. In the actual device, the diodes 28–29 are a single distributed diode defined by the resistor region itself.

A diode 30 is connected between the ground terminal 18 and the gates 20 and 22 to be protected. The diode 30 has its anode connected to the terminal 18 and its cathode connected to the gates 20 and 22.

FIG. 2 illustrates the construction of the circuit 10 in integrated circuit form. An integrated circuit device 32 is shown which includes a body of silicon of N type conductivity which should have a resistivity between about 0.1 and about 10 ohm cm. The body has a surface 36 adjacent to which the regions which define the active and passive circuit elements are formed.

The transistor 12 has spaced diffused source and drain regions 38 and 39 of P+ type conductivity formed adjacent to the surface 36. To provide a substrate for the N type transistor 14 there is a P type region 40, called a P well, which has a greater depth of diffusion and a more gradual impurity concentration gradient than the P+ type regions 38 and 39. Within the P well 40, the transistor 14 has N+ type source and drain regions 42 and 43, respectively.

The gate electrodes 20 and 22 of the transistors 12 and 14 overlie the spaces between the respective source and drain regions and are separated therefrom by thin gate insulators 44 and 45 which are formed, for example, by oxidizing the surface of the body 34.

Also shown in FIG. 2 are a P+ type guard ring region 46 which surrounds the transistor 14 and an N+ type guard ring region 48 which surrounds the transistor 12. Other regions, not shown, may include P+ type or N+ type regions which function as resistors, tunnels, or the like.

The function of the resistor 26 is provided by a diffused region 50 of P+ type conductivity which is formed at the same time as the source and drain regions 38 and 39 of the transistor 12 in accordance with the basic principle of integrated circuit construction that as many regions as possible of the same type conductivity be formed at the same time, i.e. in the same diffusion step. The function of the diodes 28–29 is provided by the PN junction 52 between the region 50 and the body 34 of the device. Metallic conductors 60 and 61 are connected to the respective opposite ends of the region 50 and extend to the elements between which the resistor region 50 is desired to be connected.

The function of the diode 30 of FIG. 1 is provided by a diffused cathode region 62 of N+ type conductivity adjacent to the surface 36 within the P well 40, which latter region serves as an anode region. A metallic contact 65 serves to connect the region 62 to the metallic contact 61 by means of a lead schematically represented at 65.

The operation of the circuit 10 is known. It has been described, for example, in application note ICAN 6128 published by RCA Corporation in February 1970. Essentially, the circuit limits the voltage across the gate insulators of the transistors 12 and 14 to a value no higher than approximately the reverse breakdown voltages of the diodes 28–29 and 30.

The circuit 10 operates successfully in the protection of most circuits. It has been discovered, however, that there are many circuits such as RC multivibrators or logic level connectors which cannot be made to operate or to operate efficiently when the circuit 10 is used. The limitation is that the input voltage is clamped by the circuit 10 to values which are above $V_{dd}$ and below $V_{ss}$ by only an amount equal to the forward voltage drop of the diodes 28–29 and 30. In other words, as soon as the input voltage goes slightly higher than $V_{dd}$, the diodes 28–29 are biased into conduction and no higher voltage can then be impressed on the input terminal 24. Likewise, as soon as the input voltage falls slightly below $V_{ss}$, the diode 30 is forwardly biased and no further voltage can be impressed on the input terminal. In the case of multivibrators, for example, these limitations degrade the efficiency and/or the frequency stability of the device.

It is known to connect back-to-back diodes across the gate insulator of an insulated gate field effect transistor. See Khajezadeh et al., U.S. 3,512,058, issued May 12, 1970. This has the effect of extending the clamping limit to about one reverse breakdown voltage value above the clamping limit obtained with a single diode. Signal limiting resistors like the diffused region 50 have not been used in these discrete devices, however. The devices have usually been intended for operation at frequencies much higher than those at which COS/MOS integrated circuit devices are operated. At such high frequencies, the RC time delay of the protective circuitry must be kept relatively short for proper operation. The resistance and capacitance of a diffused resistor region are such that a time delay too long for this purpose is usually present. On the other hand, back-to-back protective diodes have not been used in COS/MOS integrated circuits heretofore, because it has not been known how such a structure may be effectively achieved in a complex integrated circuit device.

THE DRAWINGS

THE PREFERRED EMBODIMENT

Figure 3:
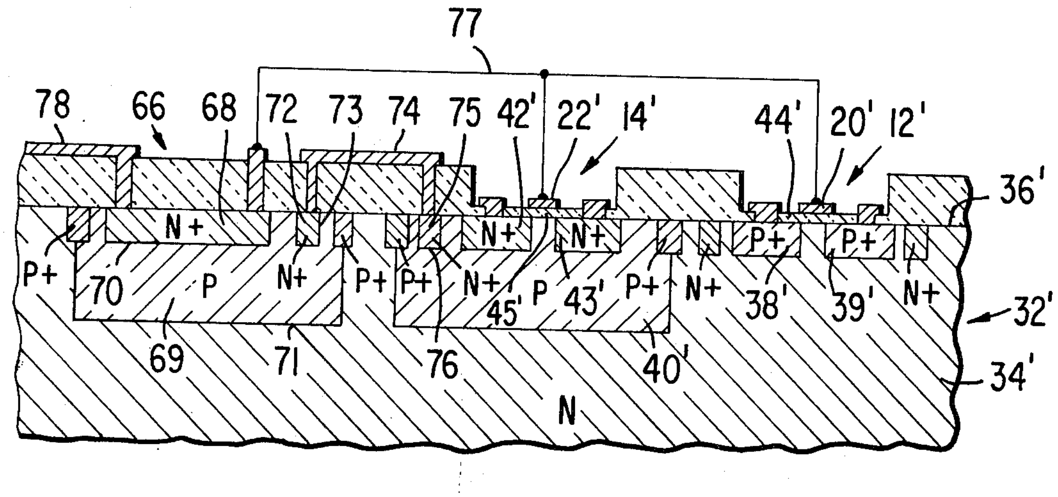
FIG. 3 is a cross section similar to FIG. 2 but illustrating the present novel construction.

As shown in FIG. 3, an integrated circuit device 32' includes transistors 12' and 14' which are similar to the above described transistors 12 and 14. In particular, the device 32' includes a body 34' of one type conductivity, N type in this example, having a surface 36' adjacent to which the diffused regions of the device are formed.

The transistor 12' has spaced source and drain regions 38' and 39' of P+ type conductivity, while the transistor 14' has a diffused P type well region 40' and spaced N+ type source and drain regions 42' and 43' respectively. The gate electrodes 20' and 22' of the transistors 12' and 14' are separated from the semiconductor body by insulators 44' and 45', respectively. Additional known elements such as guard ring structures may also be included.

The present novel protection means is designated generally by the numeral 66 in FIG. 3. The protection means 66 includes a first region 68 of the same type conductivity as the body 34' which is an elongated resistor region and is preferably formed at the same time as the N+ type source and drain regions 42' and 43' of the transistor 14'. The resistor region 68 is disposed within a first region 69 of P type conductivity which preferably is formed at the same time as the well region 40'. A PN junction 70 is defined by the regions 68 and 69. Another PN junction 71 is defined by the region 69 and the body 34'.

The first P type region 69 also contains a second N+ type region 72, which defines a PN junction 73 therewith. The second N+ type region 72 is connected by means of a deposited metal conductor 74 to a third N+ type region 75 which is disposed within the well region 40' and defines a PN junction 76 therewith. The gates 20' and 22' to be protected are connected to one end of the resistor region 68 by means of a connector shown schematically at 77. The other end of the resistor region 68 is connected to an input terminal, not shown, by means of a connector 78.

Figure 4:
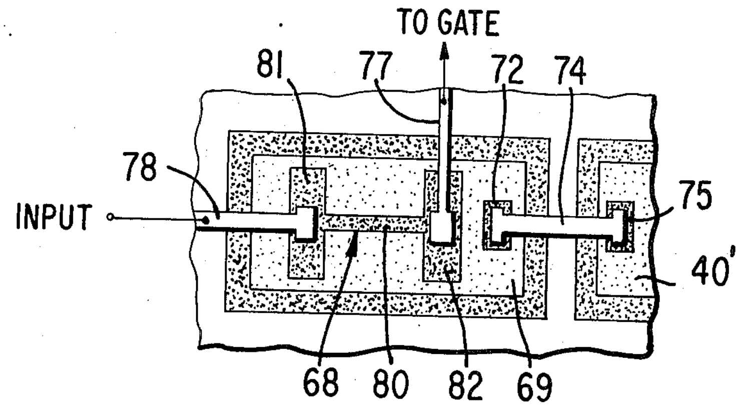
FIG. 4 is a plan view of a portion of the device of FIG. 3.

FIG. 4 illustrates the protecting elements in plan view and is provided to illustrate the novel plan configuration of the resistor region 68. As shown, the resistor region 68 has a narrow elongated portion 80 with enlarged zones 81 and 82 at the respective opposite ends thereof. Contact is made to the resistor region 68 at the enlarged zones 81 and 82. It is known in general to provide diffused resistors with enlarged end regions for permitting contact thereto. Conventionally, the contact zones have a predetermined area just large enough to permit relatively easy contact. Here, the enlarged zones 81 and 82 are much larger and may be very much larger than the conventional enlarged contact regions. The purpose of this configuration is to provide relatively large area and consequently a relatively high junction capacitance for the PN junction 70 between the resistor region 68 and the first P type region 69. If desired, the size of only one of the enlarged zones 81 and 82 may be made large enough to achieve the desired capacitance.

The relatively high capacitance in the junction 70 is provided to establish a predetermined RC time constant for the protection means 66. Adequate gate oxide protection requires that the protection means have an RC time delay greater than the expected duration of the destructive transients to be protected against. In the prior art circuit 10, the resistor 26 has had, in one embodiment, a resistance of about 500 ohms and its PN junction 52 has had a capacitance of about 1 picofarad, resulting in a time delay of about 0.5 nanosecond. Other constructions extending the delay up to about 5 nanoseconds have also been used. The resistivity of an N+ type region suitable for sources and drains is inherently lower than that of a P+ type region and, to provide a similar resistance and consequently a similar time constant, an N+ type resistor region must be much longer than a P+ type resistor region. For efficient use of space, however, the elongated portion 80 of the region 68 in the present construction should not be made long enough to provide a resistance like that of the P+ type resistor 26 of the prior art circuit 10. Instead, it should be made as shown here. With this construction, the resistance of the region 68 may be less than that of the resistor region 26 of the prior circuit while its capacitance may be greater, in compensation.

Within these guidelines, the exact dimensions of the resistor region 68 may be left to the designer. As one example, the region 68 may have a resistivity of about 15 ohms per square and a length of 10 squares for an effective resistance value of about 150 ohms. An effective capacitance of about 3.3 picofarads will then provide a delay of about 0.5 nanosecond. The junction area required to achieve this capacitance is dependent upon other factors such as the doping concentrations in the regions 68 and 69 and may be determined routinely.

Figure 1:
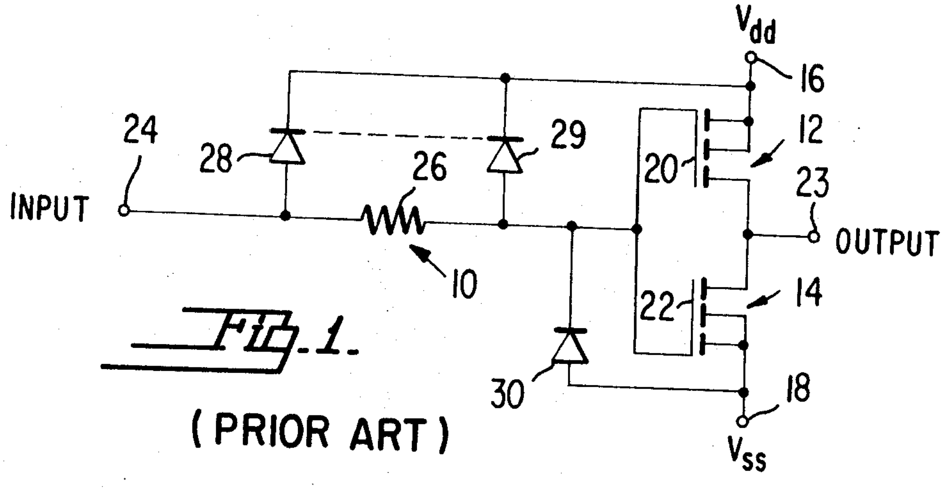
FIG. 1 (PRIOR ART)
FIG. 1 is a schematic circuit diagram of a protection circuit according to the prior art.
Figure 2:
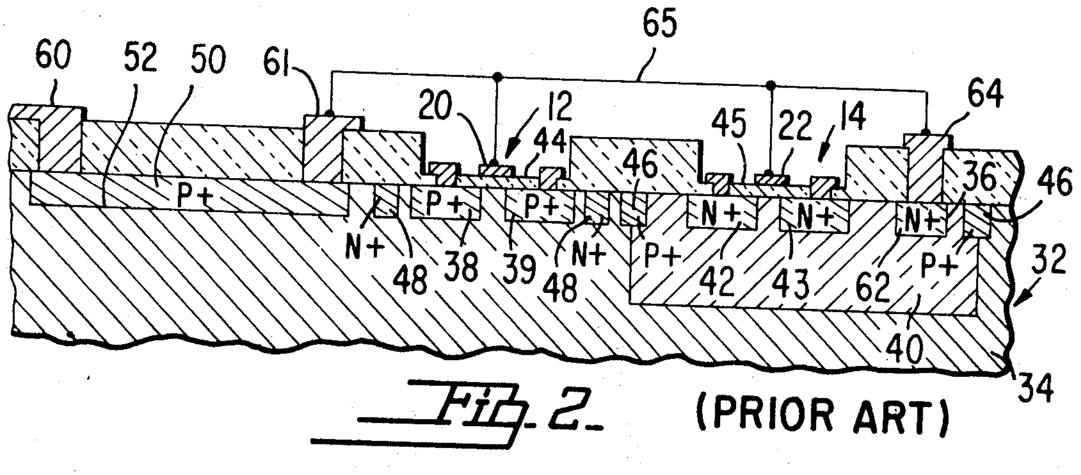
FIG. 2 (PRIOR ART)
FIG. 2 is a partial cross section of an integrated circuit device embodying the circuit of FIG. 1.

The operation of the present novel protection means will be explained with reference to the circuit diagram shown in FIG. 5. This diagram is similar to that of FIG. 1 and shows the transistors 12' and 14' connected in series between a terminal 16', labeled $V_{dd}$, and a terminal 18', labeled $V_{ss}$. The drains of the transistors 12' and 14' are connected together and to an output terminal 23'. The present novel protective means 66 is shown as connected between an input terminal 24', and the terminals 16' and 18' and the gates to be protected 20' and 22' in a manner similar to the circuit 10.

Figure 5:
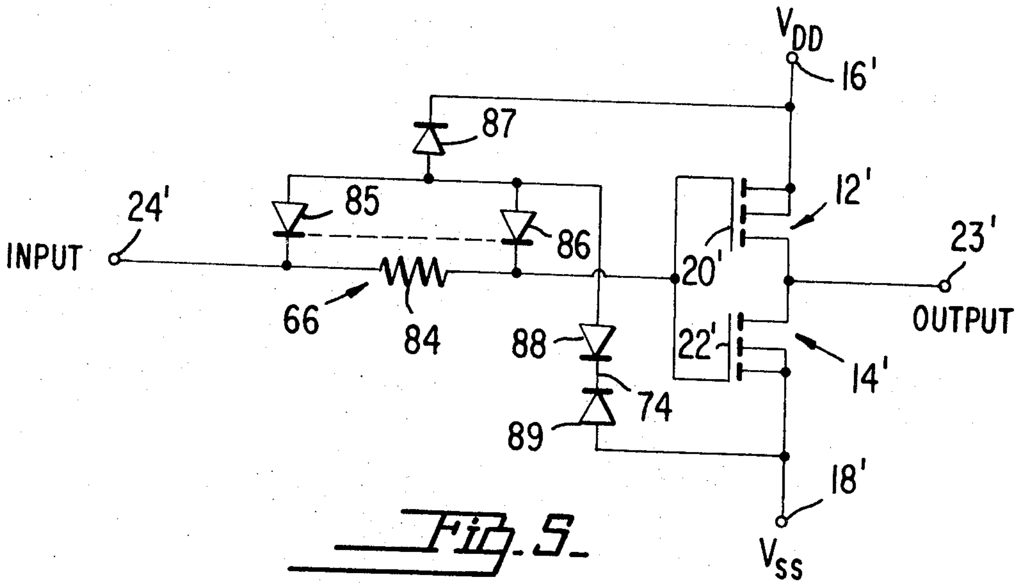
FIG. 5 is a schematic circuit diagram representing the present novel circuit.

The resistance of the region 68 is represented in FIG. 5 by a resistor 84 connected between the input terminal 24' and the gates 20' and 22'. The PN junction 70 provides a distributed diode represented in FIG. 5 by diodes 85–86 which are shown as connected to the respective ends of the resistor 84. The anodes of these diodes, which is the common material of the region 69, also forms the anode of another diode 87 which is connected between the diodes 85–86 and the terminal 16'. The junction which forms the diode 87 is the junction 71 between the region 69 and the body 34' of the device. In effect, the distributed diode 85–86 and the diode 87 form back-to-back diodes across the insulator of the transistor 12'.

The P type region 69 also forms the anode region of another diode 88, the active junction of which is the PN junction 73 between the P type region 69 and the N+ type region 72. Still another diode 89, which is in back-to-back relation to the diode 88, is formed by the junction 76 between the region 75 and the well region 40'. The diodes 85–86 and 88 may be considered as back-to-back diodes connected across the insulator of the transistor 14'.

The protective means 66 operates as follows. Consider the situation where a destructive positive transient pulse appears between the input terminal 24' and the $V_{dd}$ terminal 16', that is, the input terminal goes high with respect to $V_{dd}$. Under these circumstances, the distributed diode 85–86 is reverse biased and will break down at a voltage voltage level determined by the doping concentrations and other pehysical characteristics of the diode. In one embodiment of the present device, this value is approximately 20 volts. When the diode 85–86 breaks down, conduction takes place between the input terminal 24' and the terminal 16' and the voltage across the insulator of the resistor 12' is then limited to a value equal to the reverse breakdown voltage of the diode 85–86 and the forward voltage drop through the diode 87.

If the destructive positive transient is applied to the terminal 18' with respect to the input terminal 24' the transistor 14' is protected as follows. Under these circumstances, the diode 88 is reverse biased. At a voltage level equal to the reverse breakdown voltage of the diode 88, conduction takes place and the voltage across the insulator of the transistor 14' is then limited to a value equal to the reverse breakdown voltage of the diode 88 and the sum of the forward voltage drops of the diode 89 and the distributed diodfe 85–86.

The diode 89 is required in this circuit because the diode 88 and the distributed diode 85–86 share a common anode region. If the diode 89 were not present, the anode region 69 would be clamped to $V_{ss}$ during positive excursions of the input terminal 24' above the breakdown voltage of the diode 85–86.

In the present device, the input voltage can swing one full N+ to P breakdown voltage above and below $V_{dd}$ and $V_{ss}$, respectively. Many more protected COS/MOS circuits can be realized than has been possible heretofore.

What is claimed is:

1. In an integrated circuit device of the type which has a body of semiconductive material of one type and degree of conductivity and which further has a plurality of diffused regions in said body adjacent to a surface thereof for defining circuit elements including a pair of insulated gate field effect transistors, one of which has spaced source and drain regions of conductivity type opposite to that of said body and the other having a diffused well region of said opposite type conductivity and a pair of source and drain regions of said one type conductivity within said well region, each of said insulated gate field effect transistors having a gate electrode separated from said body by a gate insulator, improved gate insulator protection means comprising back-to-back diode means connected a cross the gate insulators of both said insulated gate field effect transistors, and a resistor connected between an input terminal of said device and each gate electrode, said resistor comprising a region in said body of said one type conductivity disposed within a region of said opposite type conductivity.

2. An integrated circuit device as defined in claim 1 wherein said one type conductivity is N type.

3. An integrated circuit device as defined in claim 2 wherein said resistor has the form of a narrow elongated region with an enlarged zone at each end thereof, contact being made to each enlarged zone, said resistor defining a PN junction with the material surrounding said resistor, the size of at least one of said enlarged zones being such as to equate the product of the resistance of said resistor and the capacitance of said PN junction to a predetermined value.

4. An integrated circuit device as defined in claim 2 wherein said resistor has the form of a narrow elongated region with an enlarged zone at each end thereof, contact being made at said enlarged zones, said resistor defining a PN junction with the material surrounding said resistor, the area of at least one of said enlarged zones being much larger than the area of the contacts to said resistor.

5. In an integrated circuit device of the type which has a body of semiconductive material of one type and degree of conductivity and which further has a plurality of diffused regions in said body adjacent to a surface thereof for defining circuit elements including a pair of insulated gate field effect transistors, one of which has spaced source and drain regions of conductivity type opposite to that of said body and the other having a diffused well region of said opposite type conductivity and a pair of source and drain regions of said one type conductivity within said well region, each of said insulated gate field effect transistors having a gate electrode separated from said body by a gate insulatior, the improvement comprising means for protecting the gate insulators against breakdown due to high voltages thereacross which comprises a first region of said opposite type conductivity in said body, first and second regions of said one type conductivity within said first opposite type region, said first one type region having an elongated portion, a third region of said one type conductivity within said well region, means connecting one end of said first one type region to an input terminal of said device, mean connecting the other end of said first one type region to the gate electrodes of said insulated gate field effect transistors, and means connecting said second one type region to said third one type region.

6. An integrated circuit device as defined in claim 5 wherein said elongated region has an enlarged zone at each end thereof, contact being made to said elongated region by deposited contacts on said enlarged zones, each deposited contact having a predetermined area, the area of at least one of said enlarged zones being much larger than said predetermined area.

7. An integrated circuit device as defined in claim 5 wherein said one type conductivity is N type.

References Cited

UNITED STATES PATENTS 3,649,885 3/1972 Nienhuis ............ 317—235

OTHER REFERENCES

IEEE Trans. on Electron Devices, "Gate Protection of MIS Devices," by Lenzlinger, vol.-ed. 18, No. 4, April 1971, pp. 249–257.

JERRY D. CRAIG, Primary Examiner

U.S. Cl. X.R.

207—202; 317—235 G, 235 R